United States Patent
Abel et al.

(10) Patent No.: US 12,417,943 B2
(45) Date of Patent: Sep. 16, 2025

(54) REDUCING INTRALEVEL CAPACITANCE IN SEMICONDUCTOR DEVICES

(71) Applicant: Lam Research Corporation, Fremont, CA (US)

(72) Inventors: Joseph R. Abel, West Linn, OR (US); Bart J. Van Schravendijk, Palo Alto, CA (US); Ian John Curtin, Portland, OR (US); Douglas Walter Agnew, Portland, OR (US); Dustin Zachary Austin, Tigard, OR (US); Awnish Gupta, Hillsboro, OR (US)

(73) Assignee: Lam Research Corporation, Fremont, CA (US)

( * ) Notice: Subject to any disclaimer, the term of this patent is extended or adjusted under 35 U.S.C. 154(b) by 354 days.

(21) Appl. No.: 18/003,145

(22) PCT Filed: Jun. 28, 2021

(86) PCT No.: PCT/US2021/039444
§ 371 (c)(1),
(2) Date: Dec. 22, 2022

(87) PCT Pub. No.: WO2022/006010
PCT Pub. Date: Jan. 6, 2022

(65) Prior Publication Data
US 2023/0307290 A1    Sep. 28, 2023

Related U.S. Application Data

(60) Provisional application No. 62/705,506, filed on Jun. 30, 2020.

(51) Int. Cl.
*H01L 21/768* (2006.01)
*H01L 21/02* (2006.01)

(52) U.S. Cl.
CPC ...... *H01L 21/7682* (2013.01); *H01L 21/0228* (2013.01); *H01L 21/76814* (2013.01); *H01L 21/76837* (2013.01)

(58) Field of Classification Search
None
See application file for complete search history.

(56) References Cited

U.S. PATENT DOCUMENTS 6,265,321 B1    7/2001    Chooi et al.
6,391,147 B2    5/2002    Imafuku et al.
(Continued)

FOREIGN PATENT DOCUMENTS

JP    2003264170 A    9/2003
JP    2008166726 A    7/2008
(Continued)

OTHER PUBLICATIONS

International Preliminary Report on Patentability dated Jan. 12, 2023, in PCT Application No. PCT/US2021/039444.
(Continued)

*Primary Examiner* — Asok K Sarkar
(74) *Attorney, Agent, or Firm* — Weaver Austin Villeneuve & Sampson LLP

(57) ABSTRACT

Methods of forming air gaps in hole and trench structures are disclosed. The methods may be used to form buried voids, i.e., voids for which the top is below the top of the adjacent features. The methods include inhibition of the hole or trench structures and selective deposition at the top of the structure forming an air gap within the structures. In some embodiments, the methods are to reduce intra-level capacitance in semiconductor devices.

20 Claims, 13 Drawing Sheets

(56) References Cited

U.S. PATENT DOCUMENTS

| | | | |
|---|---|---|---|
| 7,524,750 | B2 | 4/2009 | Nemani et al. |
| 7,625,820 | B1 * | 12/2009 | Papasouliotis ........ C23C 14/046 438/677 |
| 7,939,419 | B2 | 5/2011 | Lee |
| 9,159,606 | B1 | 10/2015 | Purayath et al. |
| 9,230,983 | B1 | 1/2016 | Sharangpani et al. |
| 9,349,687 | B1 | 5/2016 | Gates et al. |
| 9,385,028 | B2 | 7/2016 | Nemani et al. |
| 9,396,989 | B2 | 7/2016 | Purayath et al. |
| 9,425,078 | B2 | 8/2016 | Tang et al. |
| 9,773,643 | B1 | 9/2017 | Singhal et al. |
| 9,978,610 | B2 | 5/2018 | Fung et al. |
| 10,037,884 | B2 | 7/2018 | Ou et al. |
| 10,096,514 | B2 | 10/2018 | Anthis et al. |
| 10,373,806 | B2 | 8/2019 | Singhal et al. |
| 10,395,944 | B2 | 8/2019 | Fung et al. |
| 10,643,846 | B2 | 5/2020 | Smith et al. |
| 10,763,108 | B2 | 9/2020 | Hausmann et al. |
| 11,293,098 | B2 | 4/2022 | Abel et al. |
| 2001/0051423 | A1 | 12/2001 | Kim et al. |
| 2007/0243693 | A1 | 10/2007 | Nemani et al. |
| 2008/0179715 | A1 | 7/2008 | Coppa |
| 2009/0137094 | A1 | 5/2009 | Lee |
| 2015/0206719 | A1 * | 7/2015 | Swaminathan ... H01L 21/76898 118/704 |
| 2015/0243545 | A1 | 8/2015 | Tang et al. |
| 2015/0303069 | A1 | 10/2015 | Narishige et al. |
| 2016/0042968 | A1 | 2/2016 | Purayath et al. |
| 2017/0053811 | A1 | 2/2017 | Fung et al. |
| 2017/0107621 | A1 | 4/2017 | Suemori |
| 2017/0250068 | A1 | 8/2017 | Ishikawa et al. |
| 2018/0005801 | A1 | 1/2018 | Singhal et al. |
| 2018/0033689 | A1 | 2/2018 | Anthis et al. |
| 2018/0061628 | A1 | 3/2018 | Ou et al. |
| 2018/0061663 | A1 | 3/2018 | Chandrashekar et al. |
| 2018/0182777 | A1 | 6/2018 | Cui et al. |
| 2019/0057858 | A1 | 2/2019 | Hausmann et al. |
| 2020/0090945 | A1 | 3/2020 | Dole et al. |
| 2023/0175117 | A1 | 6/2023 | Austin et al. |
| 2025/0154644 | A1 | 5/2025 | Jeon et al. |
| 2025/0179632 | A1 | 6/2025 | Zhang et al. |

FOREIGN PATENT DOCUMENTS

| | | |
|---|---|---|
| JP | 2013026347 A | 2/2013 |
| WO | WO-2020009818 A1 | 1/2020 |

OTHER PUBLICATIONS

International Preliminary Report on Patentability dated Oct. 13, 2022, in PCT Application No. PCT/US2021/025271.
International Search Report and Written Opinion dated Oct. 21, 2021, in application No. PCT/US2021/039444.
U.S. Advisory Action dated Feb. 16, 2021 in U.S. Appl. No. 16/032,176 [4392-1US].
U.S. Advisory Action dated May 19, 2020 in U.S. Appl. No. 16/032,176 [4392-1US].
U.S. Final Office Action dated Dec. 9, 2020 in U.S. Appl. No. 16/032,176 [4392-1US].
U.S. Final Office Action dated Mar. 11, 2020 in U.S. Appl. No. 16/032,176 [4392-1US].
U.S. Non-Final Office Action dated Aug. 4, 2021 in U.S. Appl. No. 16/032,176 [4392-1US].
U.S. Non-Final Office Action dated Jun. 25, 2020 in U.S. Appl. No. 16/032,176 [4392-1US].
U.S. Non-Final Office Action dated Oct. 3, 2019 in U.S. Appl. No. 16/032,176 [4392-1US].
U.S. Notice of Allowance dated Apr. 3, 2024 in U.S. Appl. No. 17/696,276 [4392-2US].
U.S. Notice of Allowance dated Dec. 6, 2022 in U.S. Appl. No. 16/032,176 [4392-1US].
U.S. Notice of Allowance dated May 3, 2024 in U.S. Appl. No. 17/696,276 [4392-2US].
U.S. Restriction Requirement dated Jul. 8, 2019 in U.S. Appl. No. 16/032,176 [4392-1US].
JP Office Action dated Jul. 1, 2025 in JP Application No. 2022-581361, with English Translation.
US Non-Final Office Action dated Jun. 25, 2025 in U.S. Appl. No. 17/995,292.

* cited by examiner

REDUCING INTRALEVEL CAPACITANCE IN SEMICONDUCTOR DEVICES

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

BACKGROUND

Air is a strong dielectric with its dielectric constant k being close to unity. Air gaps may be formed in semiconductor device structures to provide an ultra-low-k material separating conductors.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

One aspect of the disclosure relates to a method including providing a structure including features and an open gap between the features, the open gap including sidewall and bottom surfaces and having a depth; and performing one or more inhibition blocks, each inhibition block including:

(a) exposing the structure to an inhibition treatment to inhibit dielectric deposition on the sidewall and bottom surfaces of the gap, and (b) selectively depositing dielectric film near the top of the gap without significant deposition near the bottom surface of the gap.

In some embodiments, the method further includes closing the gap with deposited dielectric material, thereby forming a closed air gap between the features. In some embodiments, the gap is closed during an inhibition block. In some embodiments, the method includes, after the performing the one or more inhibition blocks, performing a deposition to close the gap.

In some embodiments, the method includes performing a passivation operation to remove surface inhibition species from the sidewall and/or bottom surfaces prior to closing the gap. In some such embodiments, at least one inhibition block includes a passivation operation. In some such embodiments, a passivation operation is performed after performing one or more inhibition blocks. In some embodiments, the passivation operation includes exposing the structure to an oxygen plasma.

In some embodiments, the gap is closed with surface inhibition species remaining in the closed air gap.

In some embodiments, (b) is performed without significant deposition within most of the gap.

In some embodiments, the inhibition treatment includes halogen species.

In some embodiments, the method further including depositing a conformal dielectric layer on the sidewall and bottom surfaces prior to performing the one or more inhibition blocks. In some such embodiments, exposure to the inhibition treatment results in treating the conformal dielectric layer such that inhibition species are adsorbed onto or react with the conformal dielectric layer.

In some embodiments, the method further including, after closing the gap, depositing a dielectric cap layer over the features and gap by chemical vapor deposition. In some such embodiments, the dielectric cap layer is deposited in the same chamber as the inhibition blocks are performed.

In some embodiments, the structure is a partially fabricated 3D NAND structure. In some embodiments, the structure is a partially fabricated DRAM structure. In some embodiments, the features are metal lines.

In some embodiments, (b) includes an atomic layer deposition (ALD) process. In some such embodiments, the ALD process is plasma-enhanced. In some such embodiments, the ALD process is a thermal (non-plasma) process.

In some embodiments, (b) includes a chemical vapor deposition (CVD) process. In some embodiments, the CVD process is a thermal (non-plasma) process. In some embodiments, the CVD process is plasma-enhanced.

In some embodiments, the top of the closed gap is below the top of the features. In some embodiments, the inhibition block further includes selectively removing inhibition from the top of the gap between (a) and (b).

These and other aspects are described further below with reference to the Figures.

DETAILED DESCRIPTION

In the following description, numerous specific details are set forth to provide a thorough understanding of the presented embodiments. The disclosed embodiments may be practiced without some or all these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Figure 1A:
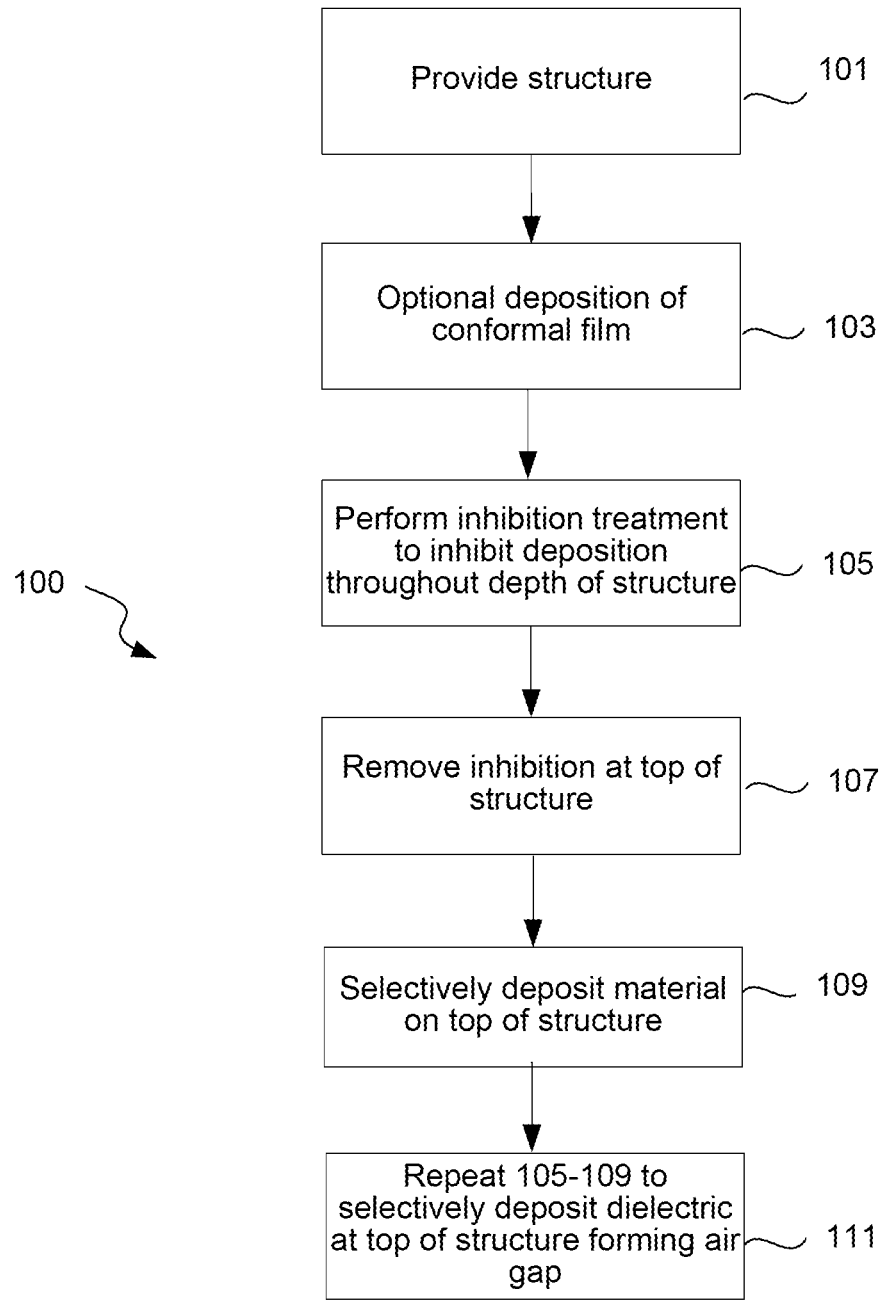
FIGS. 1a-1c are process flow diagrams showing example methods of forming an air gap.

Methods of forming air gaps in hole and trench structures are disclosed. The methods may be used to form buried voids, i.e., voids for which the top is below the top of the adjacent features. The methods include inhibition of the hole or trench structures and selective deposition at the top of the structure forming an air gap within the structures. FIG. 1a is a flow chart showing an example method 100 of forming an air gap. First, in an operation 101, a structure is provided. The structure is a hole or trench structure or other structure in which an air gap is to be formed between two features, which can be conductive features, dielectric features, semiconducting features, etc. As described further below, in some embodiments, the methods are to reduce intra-level capacitance in semiconductor devices. However, they may also be used to form air gaps in any appropriate context, including forming air gaps in metal film or layers and forming air gaps in MEMS devices.

Next, an optional conformal deposition of a material in the structure is performed in an operation 103. The material may the same or a different material than that which will be formed at the top of the structure in subsequent operations. The material is one that deposition can be inhibited in subsequent operations. For example, silicon oxide deposition can be inhibited on silicon oxide by exposure to fluorine and tungsten and other metal deposition on metal can be inhibited by exposure to nitrogen.

In some embodiments, addition to or instead of deposition of a conformal material in operation 103, a bottom-up (non-conformal) deposition may be performed if desired for air gap placement. For example, if the air gap bottom is designed to be 100 Å above the bottom of the structure, 100 Å may be deposited at the bottom.

Next, an inhibition treatment is performed to inhibit deposition throughout the depth of the structure in an operation 105. The inhibition treatment may be a plasma or thermal (non-plasma) treatment. Examples include exposing the structure to a plasma or non-plasma gas containing inhibitor species. Examples of inhibitor species include nitrogen species, halogen species, and hydrogen species. However, any species that adsorb onto, react with, or otherwise interact with the surface to passivate it and inhibit subsequent deposition may be used. If a plasma is used, it may be a remote or in-situ plasma.

Once the structure is inhibited, the inhibition at the top of the structure is removed in an operation 107. The depth of the air gap can be controlled by controlling the depth of the removal. Removal may involve exposure to reactive species that react with the inhibition species. In some embodiments, a plasma may be used to remove the inhibition species at the top. The plasma directionality may be controlled to impinge only at the top of the structure. Any reactive species that decay sufficiently as function with gap depth may be used. This can involve radical species, which may be generated in a remote plasma generator, or very dilute thermal chemistries. In some embodiments, operation 107 is part of the subsequent deposition operation 109. Examples of such an embodiment are described below with respect to FIGS. 1b and 1c. In such embodiments, the deposition chemistry also functions as a removal chemistry. However, the removal may be a separate operation.

Next, material is deposited selectively at the top of the structure in an operation 109. Any surface-selective deposition may be used including atomic layer deposition (ALD) and chemical vapor deposition (CVD). The ALD or CVD operation may be thermal or plasma-enhanced. The material deposits selectively on the non-inhibited regions at the top of the structure.

For some depositions and inhibition chemistry, the inhibition may wear off. Thus, operations 105-109 may be repeated as need until enough material is deposited at the top of the structure to close it off in an operation 111. Successive inhibition operations may be the same or different. For example, a second inhibition may be shorter if some of the inhibition from the previous inhibition is still present. Similarly, a removal and/or selective deposition may be the same or different.

Examples of forming air gaps to reduce intra-level capacitance are given below. In some embodiments, the methods include performing deposition of a dielectric with intermittent inhibition treatments. The dielectric is selectively deposited at the top of the structures forming an air gap within the structures. First, in FIG. 1b, an example of using ALD to form air gaps is provided with an example of using thermal CVD to form air gaps described with reference to FIG. 1c.

Figure 1B:
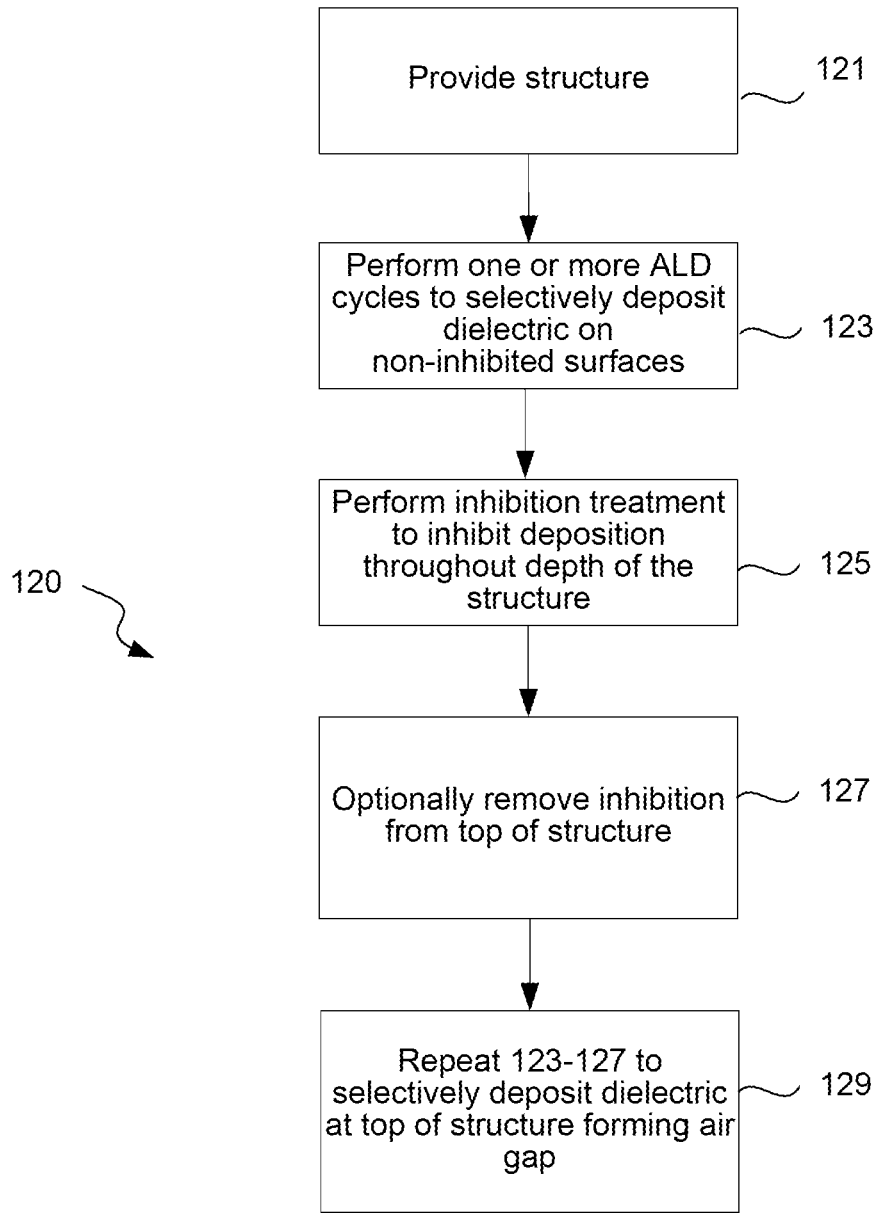

FIG. 1b is a flow chart showing an example method 120 of forming an air gap. First, in an operation 121, a structure is provided. The structure is a hole or trench structure or other structure in which an air gap is to be formed between two features, which can be interconnects, conductive lines, or other conductive features. The method also may be implemented in any context in which air gaps capped by dielectric film between features are useful. Examples of structures include 3D NAND structures such as slits, DRAM structures such as bitline structures, metal lines in back end of line (BEOL), logic gates, etc. The structures are characterized by having two or more adjacent features with an unfilled gap between the features. In many implementations, the features are conductive features, with the air gap to be formed providing very low k dielectric and reducing parasitic capacitance. However, the sidewalls surfaces of the features may be any material including conductive, dielectric, or semiconducting surfaces or a combination of these. For example, the structure may be copper (Cu) lines coated with a silicon carbide (SiC) film. The dimensions of the structure will also depend on the particular application. For example, an incoming DRAM structure may have a gap 25-50 nm wide and 300-800 nm deep and an incoming 3D NAND structure may be 50-100 nm wide and 5-8 microns deep. However, the method is not limited to any particular structure dimension, feature composition, or sidewall surfaces. In some embodiments it may be implemented in applications in which other techniques for forming air gaps (such as deposition and removal of a sacrificial material) are not difficult to implement. The structure is typically provided to a deposition chamber.

One or more ALD cycles are performed to deposit dielectric material in an operation 123. ALD is a technique that sequentially deposits thin layers of material. ALD processes use surface-mediated deposition reactions to deposit films on a layer-by-layer basis in cycles. As an example, an ALD cycle may include the following operations: (i) delivery/adsorption of a precursor, (ii) purging of the precursor from the chamber, (iii) delivery of a second reactant and optional plasma ignition, and (iv) purging of byproducts from the chamber. The reaction between the second reactant and the adsorbed precursor to form a film on the surface of a substrate affects the film composition and properties, such as nonuniformity, stress, wet etch rate, dry etch rate, electrical properties (e.g., breakdown voltage and leakage current), etc.

In one example of an ALD process, a substrate surface that includes a population of surface-active sites is exposed to a gas phase distribution of a first precursor, such as a silicon-containing precursor, in a dose provided to a chamber housing the substrate. Molecules of this first precursor are adsorbed onto the substrate surface, including chemisorbed species and/or physisorbed molecules of the first precursor. It should be understood that when a compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of first precursor remaining in gas phase so that mostly or only the adsorbed species remain. In some implementations, the chamber may not be fully evacuated. For example, the reactor may be evacuated such that the partial pressure of the first precursor in gas phase is sufficiently low to mitigate a reaction. A second reactant, such as an oxygen-containing gas, is introduced to the chamber so that some of these molecules react with the first precursor adsorbed on the surface. In some processes, the second reactant reacts immediately with the adsorbed first precursor. In other embodiments, the second reactant reacts only if a source of activation such as plasma is applied temporally. The chamber may then be evacuated again to remove unbound second reactant molecules. As described above, in some embodiments the chamber may not be completely evacuated. Additional ALD cycles may be used to build film thickness. ALD processes are described further below with respect to FIG. 4.

In operation 123, dielectric film is selectively deposited on non-inhibited surfaces relative to inhibited surfaces. In an initial ALD operation, there may be no inhibited surfaces, such that the dielectric film is deposited conformally throughout the gaps. An initial layer of dielectric film may be used to protect the underlying feature/substrate from potential damage caused by the subsequent inhibition operation. The thickness of the initial layer can depend on the feature size (e.g., a thicker initial layer can be used for larger feature sizes in 3D NAND structures than in DRAM structures). In some embodiments, at thickness of at least 50 Å or about at least 60 ALD cycle. Thickness of the initial layer may also be used to achieve a desired volume percentage of air in the gap.

In other embodiments, an inhibition operation may be performed prior to the initial iteration of operation 123 such that the dielectric film is deposited selectively at the top of the structure as in subsequent iterations. One or more ALD cycles are performed such that a thin layer of dielectric film is deposited on the non-inhibited surfaces.

Next in an operation 125, an inhibition operation is performed to inhibit deposition throughout the depth of the structure. Examples of inhibitor species include nitrogen species, halogen species, and hydrogen species. However, any species that adsorb onto, react with, or otherwise interact with the surface to passivate it and inhibit subsequent deposition may be used. In some embodiments, operation 125 is a plasma inhibition. During a plasma inhibition, the structure is exposed to a plasma generated from an inhibitor gas to form inhibitor species. Examples of inhibitor gases include nitrogen-containing gases, halogen-containing gases, and hydrogen-containing gases. Specific examples include nitrogen trifluoride ($NF_3$), molecular nitrogen ($N_2$), molecular hydrogen ($H_2$), ammonia ($NH_3$), amines, diols, diamines, aminoalcohols, thiols or combinations thereof. In some embodiments, the gas is a fluorine-containing gas, such as $NF_3$, $CH_xF_y$, where x+y=4 and y is an integer greater of equal to 1, and sulfur hexafluoride ($SF_6$). In some embodiments, thermal inhibition processes may be performed by exposing the structure to a gas that includes an inhibition chemistry under conditions that it reacts with the surface.

In some embodiments, an inhibition plasma is generated from a halogen-containing gas. Examples include $NF_3$, $CH_3F$, $CH_2F_2$, $CHF_3$, $CF_4$, $SF_6$, $CH_3Cl$, $CH_2Cl_2$, $CHCl_3$, and $CCl_4$. This results in —F, —Cl, or other halogen terminated surfaces throughout the depth of the gap that passivate the surface and inhibit subsequent deposition. The halogen containing gas may be about 0.5%-10%, 1-5%, or about 2% of the total volumetric flow to the chamber or other plasma generation space, with the remaining flow being an inert gas such as $N_2$, Ar, and He.

Operation 127 is an optional operation to selectively remove inhibitor at top of the structure. In some embodiments, operation 127 is not performed, with the inhibitor removed during the subsequent ALD. For example, the inhibitor may be removed by using a high-power plasma during PEALD. In some embodiments where high power ALD is not used, operation 127 may be performed prior to ALD to selectively remove inhibitor at the top of the structure. In some embodiments, operation 127 can involve an in-situ inert plasma exposure with the plasma generated from a gas such as $O_2$, Ar, or He. Example exposure times range from 0.1 s to 10 s, example flow rates from 0.2 slm to 10 slm, example chamber pressures from 1 T to 10 T, and example RF powers from 200 W to 2 kW. In some embodiments, a thermal inhibitor removal operation can be performed by flowing a gas such as $O_2$ or $SiH_4$ under similar conditions without striking plasma. Other examples are described above with respect to FIG. 1a. The exact conditions of this operation depend on the type of inhibitor that is used and the depth of inhibitor to be removed.

Operations 123-127 are repeated to selectively deposit dielectric film at the top of the gap in an operation 129. In some embodiments, in operation 129, operation 127 is omitted with the inhibition preferentially removed from the top of the gaps during each ALD operation 123, while remaining in the rest of the gaps. The ions in the plasma preferentially contact and remove inhibitor from the top of the gap. In some embodiments, the preferentiality can be increased by using a relatively high-power plasma for the ALD. For example, plasma power may be between 5-6 kW for 4 stations each processing a 300 mm wafer, compared to 1-3 kW for an ALD process used for conformal deposition. During the ALD operation, the dielectric material selectively deposits at the top of the gap, which is no longer inhibited. After successive iterations, enough film is selectively deposited to close off the gap, leaving the remainder of the feature unfilled. Removing an inhibitor from the top of the structure may be performed in embodiments in which an oxide is deposited, with an oxygen plasma or thermal oxygen used as one of the reactants. In other embodiments, such as when the dielectric film is a nitride, exposure to $H_2$ may remove the inhibitor if used during the ALD process or operation 127 may be performed.

Figure 1C:
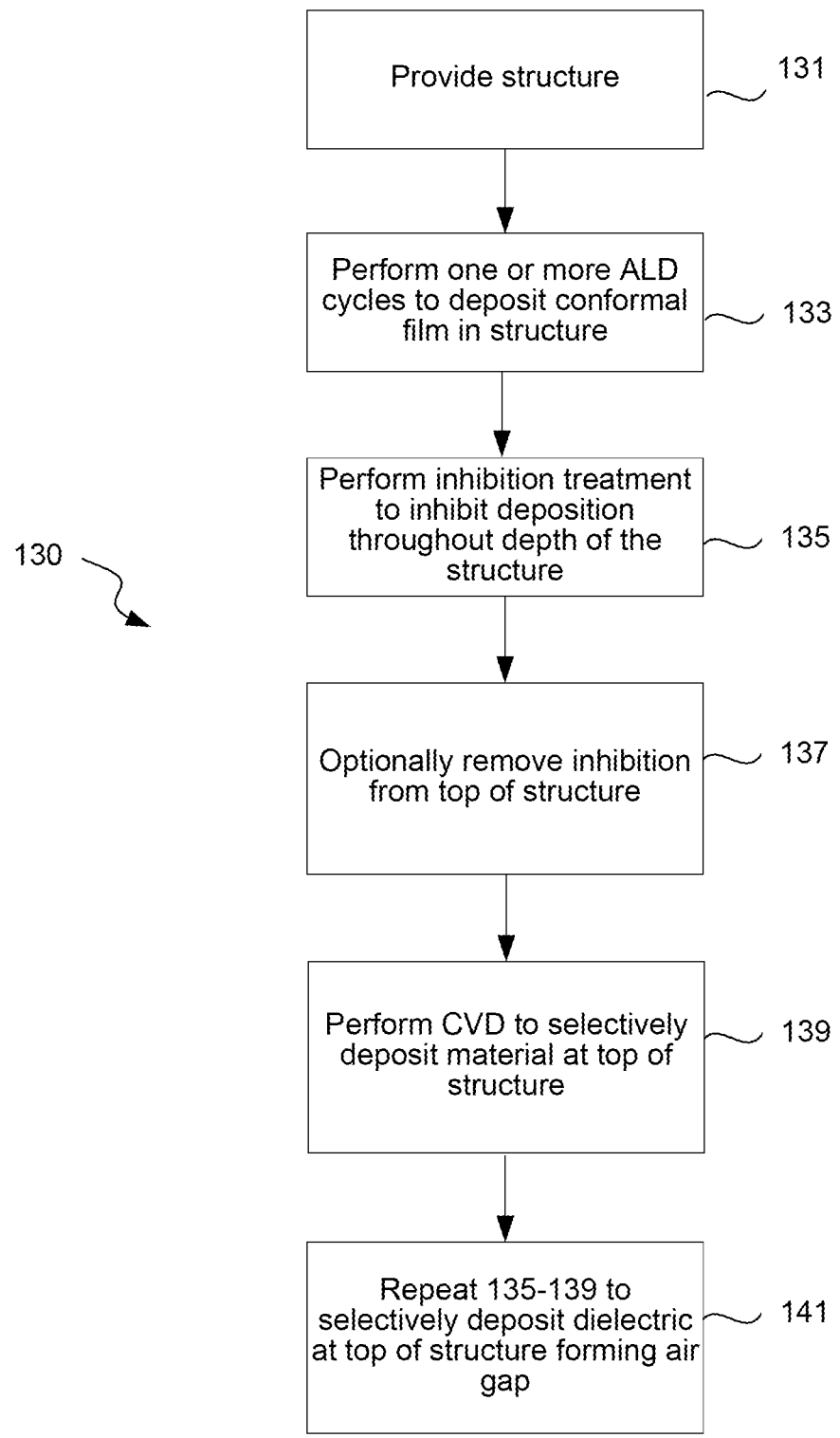

FIG. 1c is a flow chart showing an example method 130 of forming an air gap. A structure is provided in an operation 131, with examples of structures described above with respect to operation 121 of FIG. 1b. The structure is typically provided to a deposition chamber. One or more ALD cycles are performed to deposit a conformal layer of dielectric material in an operation 133. In some embodiments, operation 133 may be omitted.

Next in an operation 135, an inhibition operation is performed to inhibit deposition throughout the depth of the structure, which may be performed as described above with respect to operations 105 and 125 of FIGS. 1a and 1b, respectively.

Like operation 127 in FIG. 1b, operation 137 is an optional operation to selectively remove inhibitor at top of the structure. In some embodiments, operation 137 is not performed, with the inhibitor removed during the subsequent CVD. In some embodiments, if the deposition chemistry during CVD does not remove the inhibition species, operation 137 may be performed prior to CVD to selectively remove inhibitor at the top of the structure. In some embodiments, operation 127 can involve an in-situ inert plasma exposure with the plasma generated from a gas such as $O_2$, Ar, or He. Example exposure times range from 0.1 s to 10 s, example flow rates from 0.2 slm to 10 slm, example chamber pressures from 1 T to 10 T, and example RF powers from 200 W to 2 kW. In some embodiments, a thermal inhibitor removal operation can be performed by flowing a gas such as $O_2$ or $SiH_4$ under similar conditions without striking plasma. Other examples are described above with respect to FIG. 1a. The exact conditions of this operation depend on the type of inhibitor that is used and the depth of inhibitor to be removed.

Operation 139 is performed to selectively deposit dielectric material at the top of the structure by CVD. During the CVD reaction, a dielectric precursor and co-reactant may be co-flowed, or at least overlap, in a chamber for reaction. Examples of dielectric precursors, co-reactants, and process conditions are provided further below.

Operations 135-139 are repeated to selectively deposit dielectric film at the top of the gap in an operation 141. In some embodiments, in operation 141, operation 137 is omitted with the inhibition preferentially removed from the top of the gaps during the subsequent CVD operation 139, while remaining in the rest of the gaps. For example, fluorine inhibitor species can be removed by exposure to oxygen ($O_2$) or oxygen/hydrogen ($O_2/H_2$).

Deposition depth can be controlled by length of operations 135 and 139 (and/or operation 137, if performed). For example, for a fixed CVD time (e.g., 2 s for a single instance of operation 139), the depth of the deposited dielectric material can be tuned by varying the inhibition time. For example, for a long inhibition time (e.g., 2 s for a single instance of block 135), the dielectric material will deposit only at the top. Decreasing the inhibition time (e.g., to 1 s) can result in some sidewall deposition at the very top of the structure to form a helmet-shaped profile, with the deposition increasing with decreasing inhibition time (e.g., to 0.2 s). For fixed inhibition time (e.g., 2 s), the depth of deposition can be tuned by the CVD time. For example, a 2 s deposition may deposit only at top, an increase in CVD time to 4 s will deposit on sidewalls at the very top of the structure (helmet-shaped), etc.

Figure 2C:
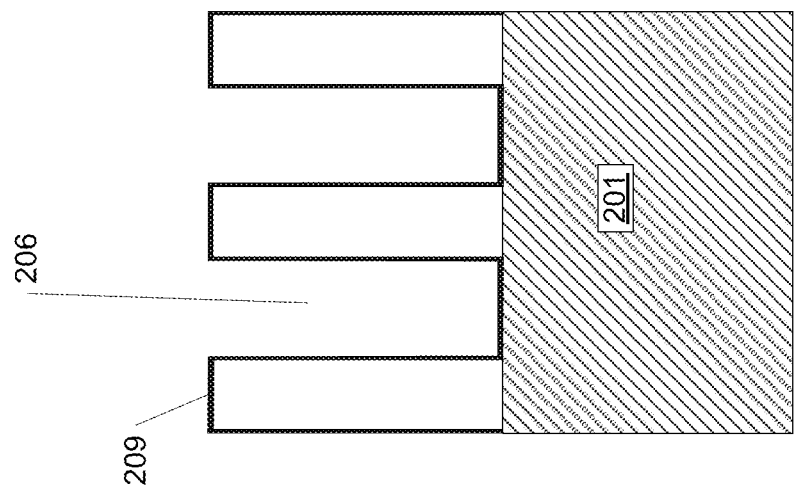
FIGS. 2a-2h are cross-sectional schematic depictions of features during operations of forming an air gap.
Figure 2B:
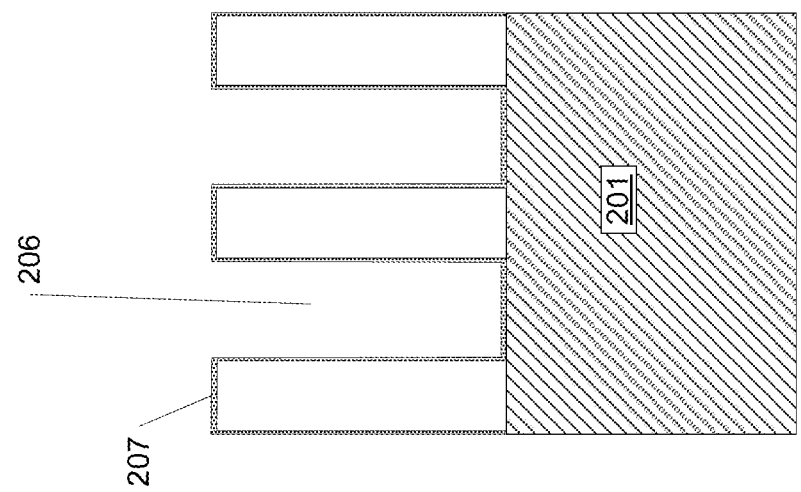
Figure 2A:
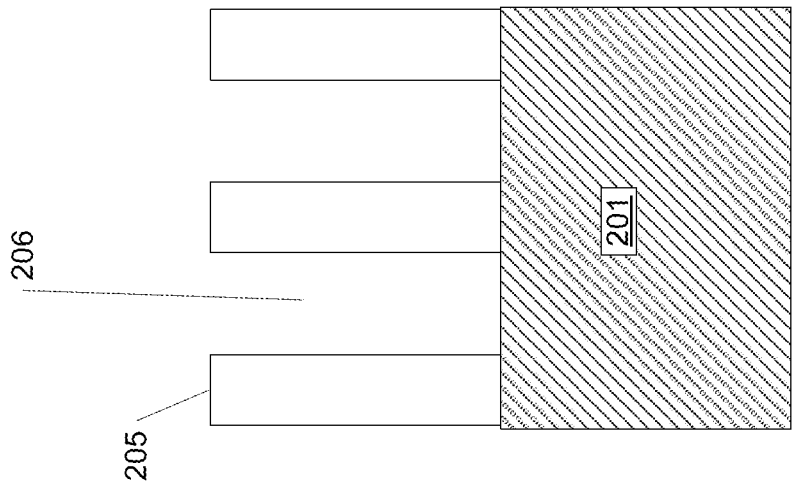

FIG. 2a shows an example of a structure including features 205 and gaps 206 on a substrate 201. The substrate 201 may be a silicon or other semiconductor wafer, e.g., a 200-mm wafer, a 300-mm wafer, or a 450-mm wafer, including wafers having one or more layers of material, such as dielectric, conducting, or semi-conducting material deposited thereon. The methods may also be applied to form structures with air gaps on other substrates, such as glass, plastic, and the like, including in the fabrication of micro-electromechanical (MEMS) devices.

Figure 2F:
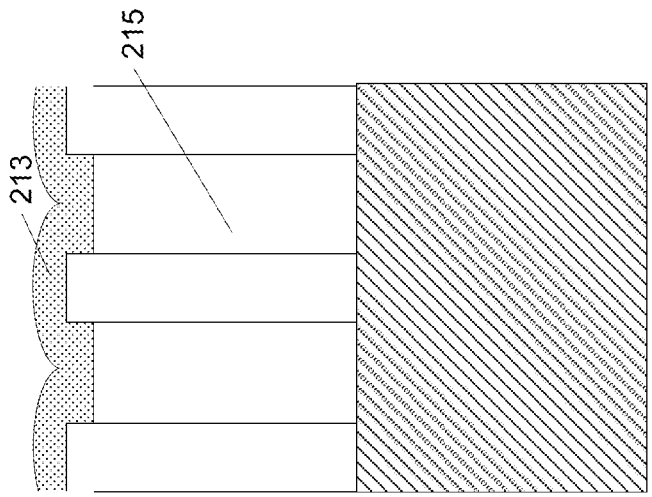
Figure 2E:
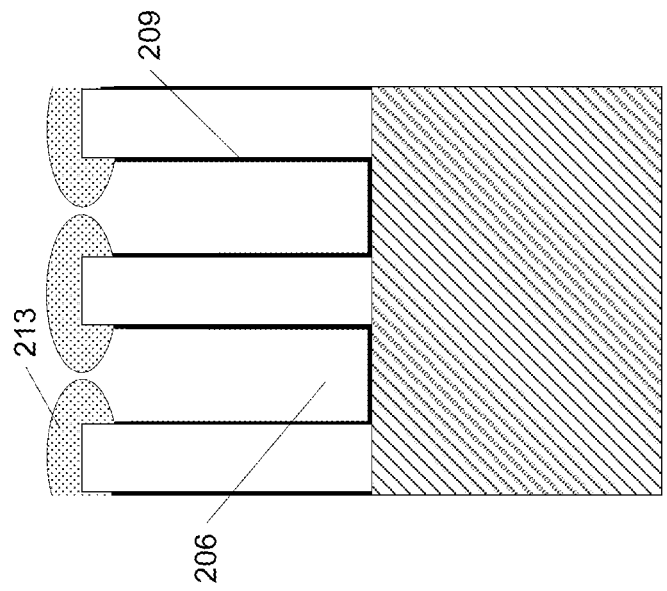
Figure 2D:
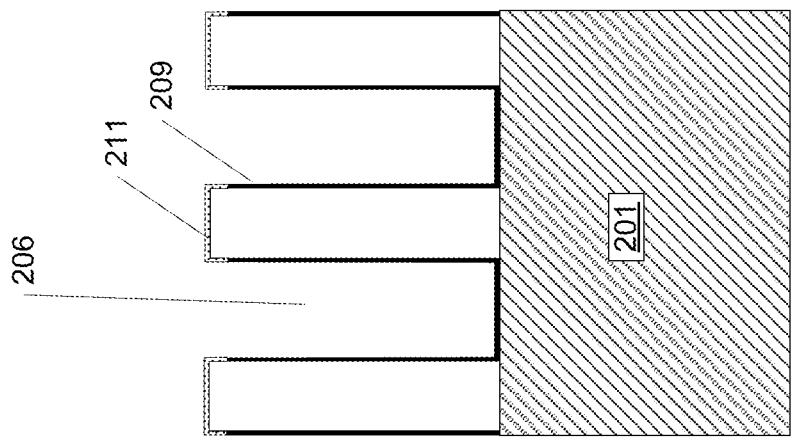

FIG. 2b shows an example of the structure including a thin film 207 deposited conformally throughout the gaps 206. This may be the structure after an initial set of ALD deposition cycles in operation 103, for example. FIG. 2c shows an example of the structure including inhibited thin film 209 disposed conformally throughout the gaps 206. This may be the structure after an initial inhibition treatment in operation 105, for example. The film deposited in as shown in FIG. 2b now may have surface fluorine species, for example, which inhibit subsequent deposition. FIG. 2d shows an example of the structure with the inhibition removed at the tops of the gaps 206, leaving uninhibited surfaces 211 and inhibited thin film 209 remaining through most of the gaps 206. This may be the structure after one or a few iterations of operation 111 in FIG. 1a. For example, it may be the structure after a number of ALD cycles in a second iteration operation 125 or after inhibition is removed in an operation 127 in FIG. 1b or after a few cycles of operations 135-139 in FIG. 1c. Significant deposition has not yet occurred, but the inhibition is removed from the tops of the features and gaps 206. FIG. 2e shows an example of the structure after a significant amount of dielectric material 213 is deposited at the tops of the gaps 206. The inhibited thin film 209 remains through most of the depth of the gaps 206. At this stage, the gaps 206 are not yet closed off by the dielectric material 213. This may be the structure after many repetitions of operation 111 in FIG. 1a, operation 129 in FIG. 1b, or operation 141 in FIG. 1c. According to various embodiments, the inhibition species in a gap may or may not be removed before the gap closes. FIG. 2f shows the structure after the gaps 206 are closed off by dielectric material 213 forming air gaps 205.

Figure 2H:
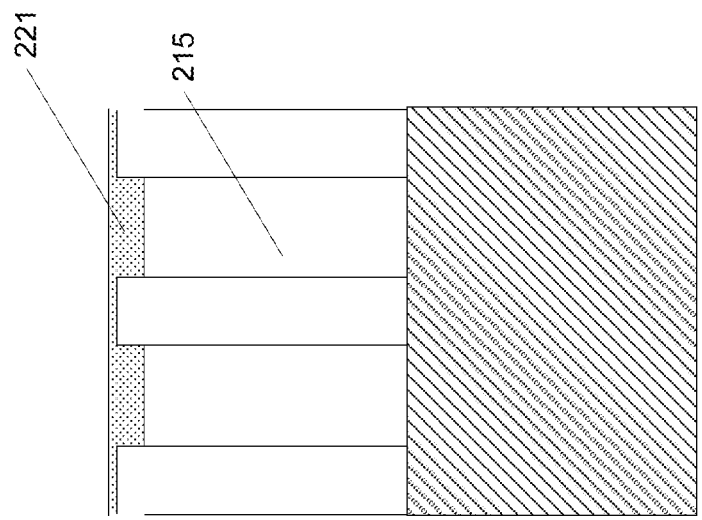
Figure 2G:
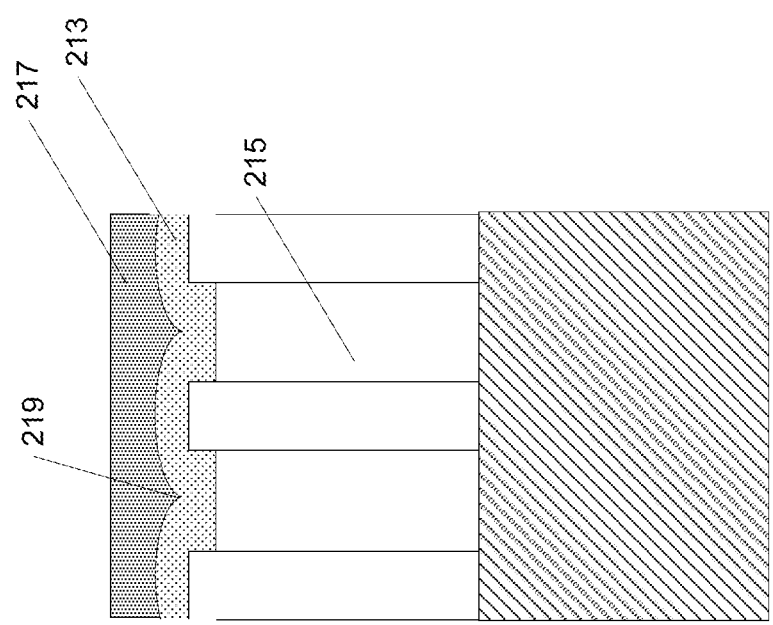

After the air gaps are formed, various operations may be performed. In some embodiments, for example, a cap layer may be deposited over the dielectric material 213. In some embodiments, dielectric film may be deposited by plasma-enhanced chemical vapor deposition (PECVD). FIG. 2g shows a structure with air gaps formed as described above having a dielectric PECVD film 217 deposited over the dielectric material 213. Indentations 219 that are centered over the air gaps 215 in the dielectric material 213 as a result of the ALD deposition are smoothed out. Although not shown in FIG. 2g, the dielectric PECVD film 217 may include indentations centered over the indentations 219, but their height may be reduced, for example, by at least 20%-90% as compared to those in the dielectric material 213. During etch and CMP steps, deep indentations can cause an uneven amount of material to be removed from the top the structure, resulting in too much material being removed from the filled feature, generating defects which affect device performance. By depositing a cap layer such as dielectric PECVD film 217 ensures that during subsequent planarization, the gap remains filled and a planarized dielectric film 221 results as shown in FIG. 2h.

In other embodiments, a cap layer may be deposited by thermal CVD. Depositing by CVD (PECVD or thermal CVD) allows for a thick film to be quickly deposited, which preferentially fills in the indentations resulting in a flatter film, reducing the frequency of the generation of defects in subsequent processing. In some operations, the CVD operation is performed in the same chamber as the inhibition and ALD operations. This greatly reduces the number of transfer operations and processing tools. Example thicknesses of a cap layer range from 1-3 kÅ. In some embodiments, thinner layers, e.g., 100-1000 Å, may be deposited.

The air gaps that are formed may occupy most of the volume of the incoming gap prior to deposition, e.g., at least 60%, at least 70%, at least 80%, at least 90%, or at least 90% of the original gap. This can also be characterized as the percentage volume occupied by air relative to the total volume occupied by air and solid material between the features.

For example, an incoming gap (e.g., a slit or memory hole) in a 3D NAND structure may be between 50-100 nm wide and 5-8 microns deep. Dielectric material may be deposited to a depth of about 500 nm, with the gap empty (filled with air) below that. About 500 nm of dielectric material may be deposited above the plane of the features. An incoming gap in DRAM structure may be 25-50 nm wide by 300-800 nm deep. Dielectric material may be deposited to a depth of about 30-50 nm, with the gap empty below that.

While the description herein refers to air gaps, the methods described herein may be used to form gaps occupied by any gas between features by performing the method in the appropriate environment.

For purposes of this document, "near" the top of the feature, near the top of the structure, or near the top of the gap, represents an area in the gap located within 25% or within 10% of the total depth as measured vertically from the top of a feature that forms a sidewall of the gap. "Near" the bottom of the feature represents an area in the gap located within 25% or within 10% of the total depth as measured vertically from the feature bottom.

Figure 3A:
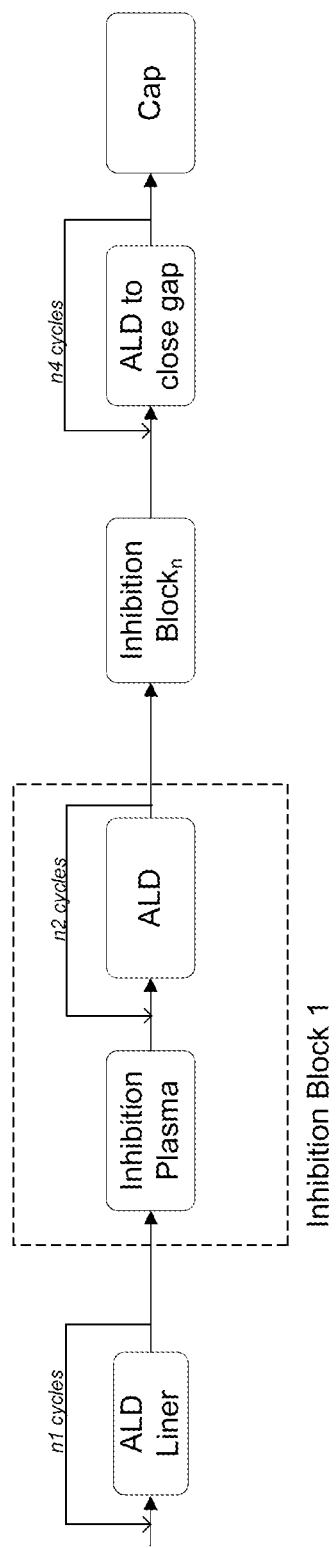
FIGS. 3a-3c are examples of process sequences according to the methods described with respect to FIG. 1b.
Figure 3B:
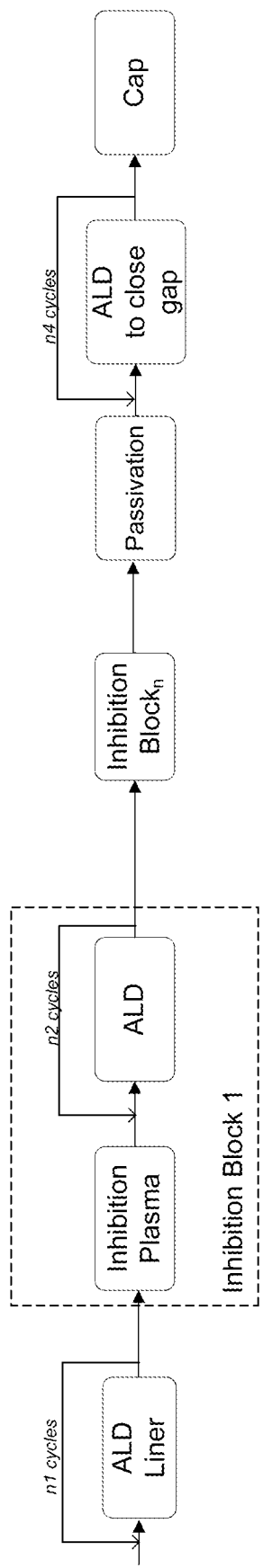
Figure 3C:
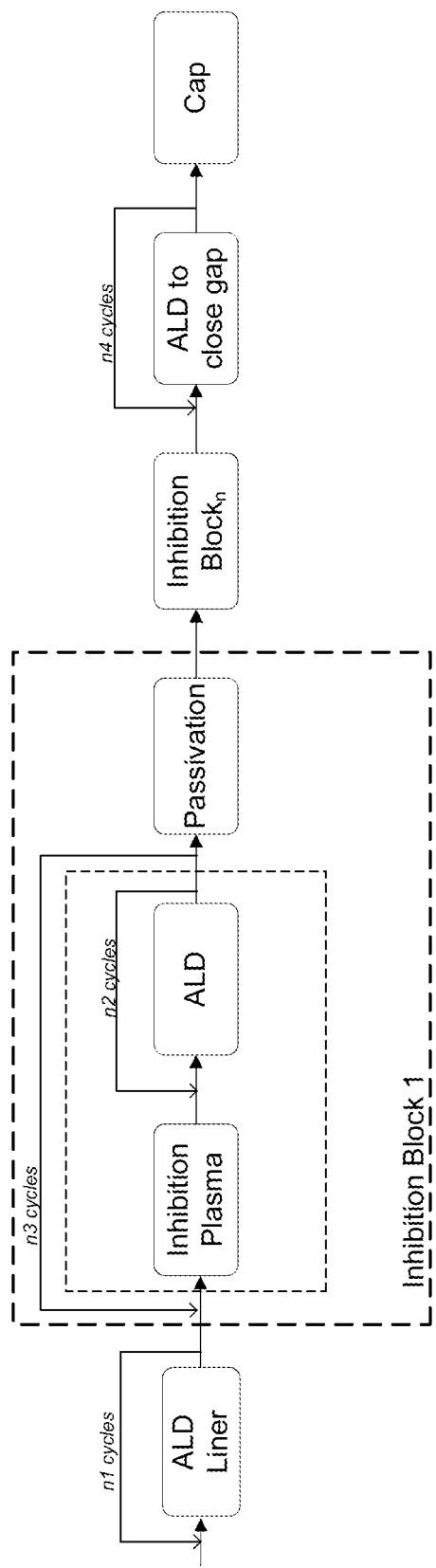

FIGS. 3a-3c are examples of process sequences according to the methods described above with respect to FIG. 1b. Certain operations (e.g., ALD liner deposition) may be omitted in certain embodiments and other operations (e.g., soak) that are not depicted may be used in certain embodiments. In the example process sequence of FIG. 3a-3c, one or more wafers are processed to form air gaps. The process sequence in each of FIGS. 3a-3c shows deposition of an ALD liner such as that shown in FIG. 2b. In some embodiments, a process may begin with a soak after being provided to a deposition chamber. This can be useful, for example, to remove particles or other pretreatment. Then, cycles of ALD deposition of a liner may be performed in some embodiments. If the underlying surface can be inhibited, the ALD liner deposition may not be performed in some embodiments. If performed, ALD deposition of a liner involve n1 ALD cycles, with the ALD process described further below.

After deposition of the ALD liner, n inhibition blocks are performed, with the operations of the first inhibition block (n=1) shown. The first operation is the inhibition plasma, which is a surface treatment. As discussed above, the plasma may include halogen species including anion and radical species such as F—, Cl—, I—, Br—, fluorine radicals, etc. Other inhibition plasmas may be used, or for example, plasmas generated from molecular nitrogen ($N_2$), molecular hydrogen ($H_2$), ammonia ($NH_3$), amines, diols, diamines, aminoalcohols, thiols or combinations thereof may be used. The inhibition chemistry depends on the material to be deposited. For example, hydrogen may be a passivation plasma after fluorine inhibition of silicon oxide but acts as an inhibition plasma for other materials to be deposited.

When the inhibition plasma interacts with material in the feature, the material at the bottom of the feature can receive less plasma treatment than material located closer to a top portion of the feature or in field because of geometrical shadowing effects. While these effects can be useful in gap fill applications, in the air gap formation methods described herein, the entire gap is inhibited. To accomplish this, the inhibition plasma may be relatively long. In some embodiments, for example, an inhibition plasma of about 5 seconds to 1 minute may be used. Plasma duration depends on the particular structure; for example, 3D NAND structures have long and tortuous paths to inhibit the entire gap and may be exposed to the plasma for 10 seconds to 1 minute. For DRAM structures, an inhibition time of 5 seconds to 15 seconds may be used. In addition to inhibition plasma duration, plasma power may be increased, inhibition gas flow rate may be increased, and pressure may be decreased relative to an inhibition that is preferential to the top of the feature.

As a result, deposition throughout the feature is inhibited. In FIG. 3a, the next operation in the inhibition block is n2 cycles of ALD. As discussed above, a high-power plasma is used during the ALD operation of the inhibition block. The inhibition is selectively removed from the top of the feature and as a result, dielectric material is deposited selectively at the top of the feature.

The number of cycles n2 in an inhibition block can depends on how quickly the inhibition effect wears off at the top of the structure (allowing selective as well as deeper in the gap. The Examples include 10-30 cycles, though it will be understood that it can be fewer or significantly more cycles.

In some embodiments, a single inhibition block may be sufficient. In other embodiments, one or more additional inhibition blocks may be performed for a total of n inhibition blocks. According to various embodiments, n2 may be the same or different for different inhibition blocks. Inhibition plasma and ALD conditions may be changed from inhibition block to inhibition block to fill the feature.

When the feature is nearly closed off, inhibition may no longer be necessary, and the gap can be completed with n4 cycles of ALD to close the gap. The conditions during this operation may be more similar to a typical ALD operations, e.g., plasma power may be less than during the inhibition block. In some embodiments, the gap may be closed during the last inhibition block such that a separate ALD operation is not performed. A cap or overburden layer of dielectric may then be deposited as described above.

In the example of FIG. 3a, the surface inhibition species are not removed from the gap. In other embodiments, an operation may be performed to remove them. FIG. 3b shows a process sequence in which a passivation operation is performed. The sequence in FIG. 3b is the same as that in FIG. 3a apart from a passivation operation performed after all the inhibition blocks are performed but before the gap is closed. Passivation is a surface treatment that removes residual inhibitor and can also densify the deposited film. In some embodiments, a plasma generated from oxygen ($O_2$), a plasma generated from hydrogen ($H_2$), a plasma generated from $H_2/O_2$, or a plasma generated from $Ar/H_2$ is used. Thermal treatments using these gases may be used.

FIG. 3c shows another example of a process sequence in which a passivation operation is performed. In the example of FIG. 3c, passivation is performed at the end of each inhibition block, rather than only at the end of the process.

Figure 4:
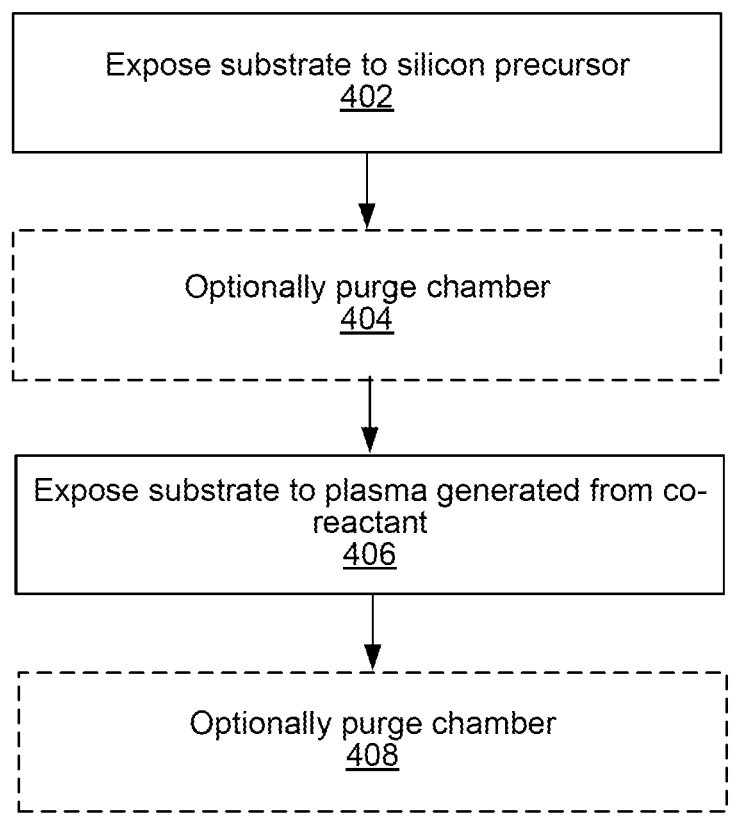
FIG. 4 is a process flow diagram for a single plasma enhanced ALD cycle that implemented as part of a method of forming an air gap.

FIG. 4 presents a process flow diagram for a single plasma enhanced ALD cycle that may be implemented as part of operation 103 in FIG. 1a to selectively deposit dielectric material on non-inhibited surfaces and/or as part of any of the ALD operations shown in FIGS. 3a-3c. In an operation 402, the substrate is exposed to a silicon-containing precursor, to adsorb the precursor onto the surface of the feature. This operation may be self-limiting. In some embodiments, the precursor adsorbs to less than all the active sites on the surface of the feature. In an operation 404, the process chamber is optionally purged to remove any unadsorbed silicon-containing precursors. In an operation 406, the substrate is exposed to a plasma generated from a co-reactant. Examples include $O_2$ and/or $N_2O$ to form a silicon oxide layer, $N_2$ or $NH_3$ to form a silicon nitride layer, etc. In operation 408, the process chamber is optionally purged to remove byproducts from the reaction between the silicon-containing precursor and the oxidant. Operations 402 through 408 repeated for a number of cycles to deposit the silicon-containing layer to a desired thickness in the feature.

It should be noted that the processes described herein are not limited to a particular reaction mechanism. Thus, the process described with respect to FIG. 4 includes all deposition processes that use sequential exposures to silicon-containing reactants and conversion plasmas, including those that are not strictly self-limiting. The process includes sequences in which one or more gases used to generate a plasma is continuously flowed throughout the process with intermittent plasma ignitions.

For depositing silicon oxide, one or more silicon-containing precursors may be used. Silicon-containing precursors suitable for use in accordance with disclosed embodiments include polysilanes ($H_3Si$—$(SiH_2)n$-$SiH_3$), where n>0. Examples of silanes are silane ($SiH_4$), disilane ($Si_2H_6$), and organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like.

A halosilane includes at least one halogen group and may or may not include hydrogens and/or carbon groups. Examples of halosilanes are iodosilanes, bromosilanes, chlorosilanes, and fluorosilanes. Specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like.

An aminosilane includes at least one nitrogen atom bonded to a silicon atom, but may also contain hydrogens, oxygens, halogens, and carbons. Examples of aminosilanes are mono-, di-, tri- and tetra-aminosilane ($H_3Si(NH_2)$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tert-butylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)$). In some embodiments, an aminosilane that has two or more amine groups attached to the central Si atom may be used. These may result in less damage than aminosilanes having only a single amine group attached.

Further examples of silicon-containing precursors include trimethylsilane (3MS); ethylsilane; butasilanes; pentasilanes; octasilanes; heptasilane; hexasilane; cyclobutasilane; cycloheptasilane; cyclohexasilane; cyclooctasilane; cyclopentasilane; 1,4-dioxa-2,3,5,6-tetrasilacyclohexane; diethoxymethylsilane (DEMS); diethoxysilane (DES); dimethoxymethylsilane; dimethoxysilane (DMOS); methyl-diethoxysilane (MDES); methyl-dimethoxysilane (MDMS); octamethoxydodecasiloxane (OMODDS); tert-butoxydisilane; tetramethylcyclotetrasiloxane (TMCTS); tetraoxymethylcyclotetrasiloxane (TOMCTS); triethoxysilane (TES); triethoxysiloxane (TRIES); and trimethoxysilane (TMS or TriMOS).

As indicated above, an ALD process may be used to deposit a conformal liner and a dielectric material selectively at the top of the structure. The same or different silicon precursor may be used for the ALD liner as for subsequent dielectric deposition. In some embodiments, the plasma power is higher for the selective deposition at the top of the structure than for the conformal ALD liner. In various embodiments, the plasma is an in-situ plasma, such that the plasma is formed directly above the substrate surface. In such embodiments, example plasma powers for ALD operations that are performed as part of inhibition blocks or to close off the gap are 1.7-2.2 W/cm$^2$. Example plasma powers for ALD operations that are performed for conformal deposition are 0.3-1.1 W/cm$^2$.

Example plasma powers for the inhibition operation may range from 0.20-1.1 W/cm$^2$ or from 0.20-0.6 W/cm$^2$.

Chamber pressure for the ALD and inhibition operations may be about 1-20 Torr, or 1-10 Torr.

Figure 3D:
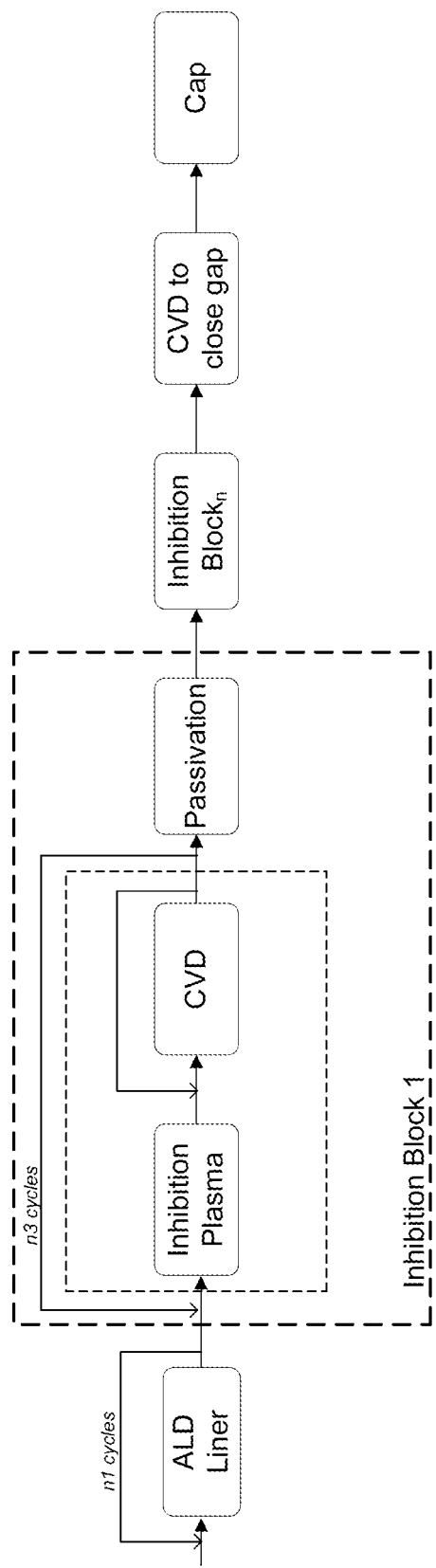
FIG. 3d is an example of a process sequence according to the methods described with respect to FIG. 1c.

The processes sequences in FIGS. 3a-3c may be modified for CVD deposition at the top of the gap. For example, FIG. 3d is an example of a process sequence according to the methods described above with respect to FIG. 1c and is similar to the process sequence in FIG. 3c, with CVD instead of multiple ALD cycles. Certain operations (e.g., ALD liner deposition) may be omitted in certain embodiments and other operations (e.g., soak) that are not depicted may be used in certain embodiments. In the CVD operations, both the deposition precursor (e.g., Si-containing reactant) and co-reactant may be simultaneously delivered to the process chamber to generate a processing environment in the chamber that includes both the deposition precursor and the co-reactant. Example precursors and co-reactants are given above. In some embodiments, the deposition precursor and co-reactant flow are turned on at different times, but there is at least some duration for which both flow of the deposition precursor and flow of the reactant are on at the same time, thereby creating a processing environment in the process chamber that includes both the deposition precursor and the reactant. This thermal CVD process may be performed for any suitable duration. The duration of this operation as described herein means the duration in which the substrate is exposed to the processing environment that includes both the deposition precursor and the reactant. Example durations range from 0.1 to 10 seconds.

The deposition rate may be between about 3 Å/s and about 16 Å/s or at least about 12 Å/s. In some embodiments, the pressure of the process chamber may be between about 9 Torr and about 25 Torr. The gas flow rates depend on the gases being used. In some embodiments, the deposition precursor is flowed at a range between about 1000 sccm and about 3000 sccm, and the oxidant is flowed at a range between about 2000 sccm and about 5000 sccm. In some embodiments, hydrogen is co-flowed with the oxidant at a flow rate of between 0 sccm and about 5000 sccm. Where hydrogen is not co-flowed, hydrogen's flow rate is 0 sccm. In some embodiments, n3, the number of inhibition/CVD cycles, is between 20 and 80, though this is highly dependent on the gap size.

Examples of processes using PEALD and thermal CVD are given above. However, it will be appreciated that any surface sensitive deposition technique may be used, include thermal ALD, remote plasma ALD, and PECVD.

Apparatus

Figure 5:
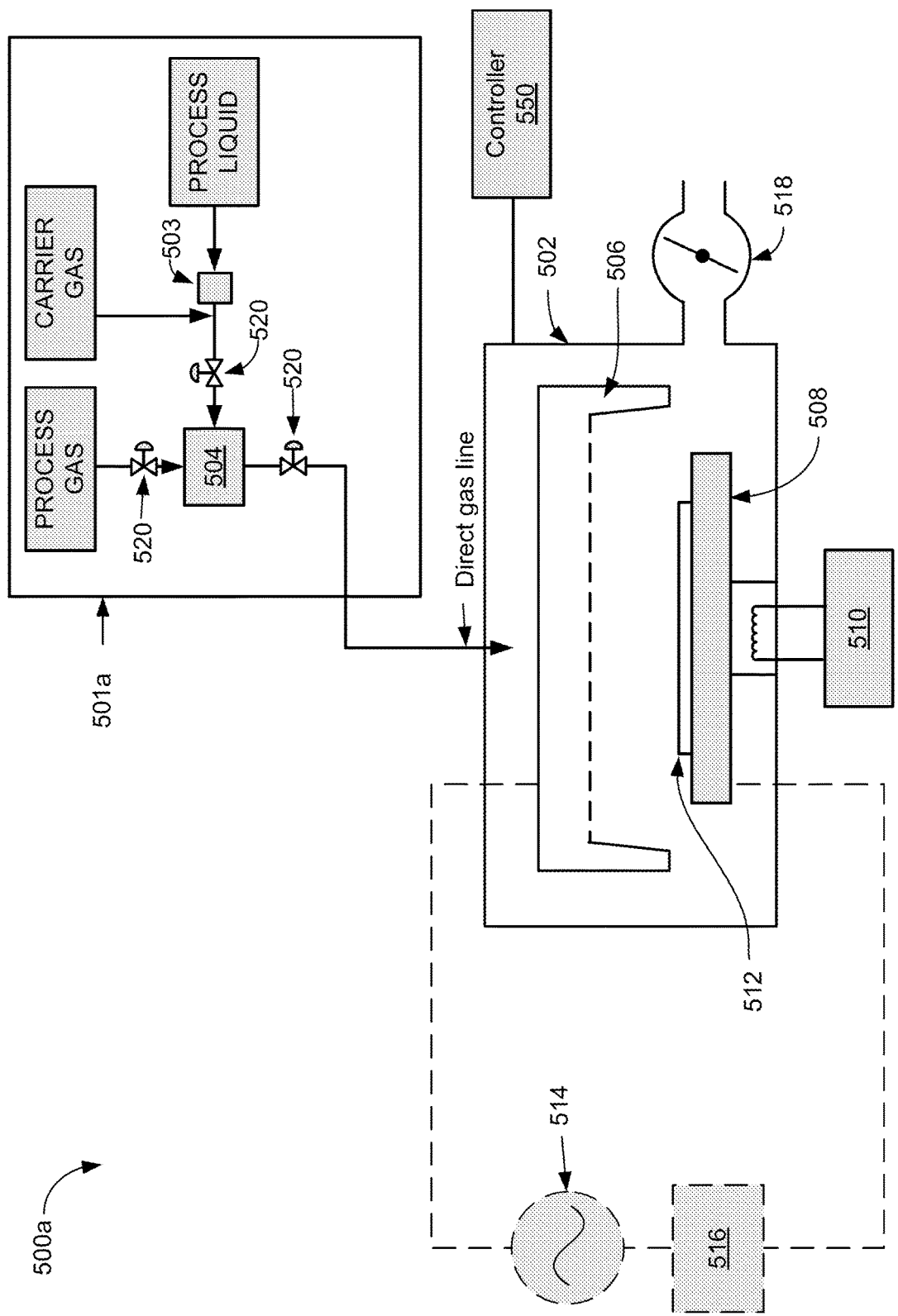
FIG. 5 is a schematic illustration of an embodiment of an atomic layer deposition (ALD) process station that may be used to perform methods described herein.

FIG. 5 depicts a schematic illustration of an embodiment of an atomic layer deposition (ALD) process station 500 having a process chamber body 502 for maintaining a low-pressure environment. A plurality of ALD process stations 500 may be included in a common low-pressure process tool environment. For example, FIG. 5 depicts an embodiment of a multi-station processing tool 500. In some embodiments, one or more hardware parameters of ALD process station 500, including those discussed in detail below, may be adjusted programmatically by one or more system controllers 550.

ALD process station 500 fluidly communicates with reactant delivery system 501a for delivering process gases to a distribution showerhead 506. Reactant delivery system 501a includes a mixing vessel 504 for blending and/or conditioning process gases for delivery to showerhead 506. In some embodiments, an inhibitor gas may be introduced to the mixing vessel prior to introduction to the chamber body 502, such as if provided with a carrier gas. In some embodiments, an inhibitor or other gas may be directly delivered to the chamber body 502. One or more mixing vessel inlet valves 520 may control introduction of process gases to mixing vessel 504. These valves may be controlled depending on whether a reactant gas, inhibitor gas, or carrier gas may be turned on during various operations. In some embodiments, an inhibitor gas may be generated by using an inhibitor liquid and vaporizing using a heated vaporizer.

As an example, the embodiment of FIG. 5 includes a vaporization point 503 for vaporizing liquid reactant to be supplied to the mixing vessel 504. In some embodiments, vaporization point 503 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 503 may be heat traced. In some examples, mixing vessel 504 may also be heat traced. In one non-limiting example, piping downstream of vaporization point 503 has an increasing temperature profile extending from approximately 100° C. to approximately 150° C. at mixing vessel 704.

In some embodiments, liquid precursor or liquid reactant, such as a silicon-containing precursor, may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 503. In one scenario, a liquid injector may be mounted directly to mixing vessel 504. In another scenario, a liquid injector may be mounted directly to showerhead 506.

In some embodiments, a liquid flow controller (LFC) (not shown) upstream of vaporization point 503 may be provided for controlling a mass flow of liquid for vaporization and delivery to process station 500. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 506 distributes gases toward substrate 512. For example, showerhead 506 may distribute an inhibitor gas to the substrate 512, silicon-containing precursor gas to the substrate 512, or a purge or carrier gas to the chamber body 502, a second reactant to the substrate 512, or a passivation gas to the substrate 512, in various operations. In the embodiment shown in FIG. 5, the substrate 512 is located beneath showerhead 506 and is shown resting on a pedestal 508. Showerhead 506 may have any suitable shape and may have any suitable number and arrangement of ports for distributing process gases to substrate 512.

In some embodiments, a microvolume is located beneath showerhead 506. Practicing disclosed embodiments in a microvolume rather than in the entire volume of a process station may reduce reactant exposure and purge times, may reduce times for altering process conditions (e.g., pressure, temperature, etc.) may limit an exposure of process station robotics to process gases, etc. Example microvolume sizes include, but are not limited to, volumes between 0.1 liter and 2 liters. This also impacts productivity throughput. In some embodiments, the disclosed embodiments are not performed in a microvolume.

In some embodiments, pedestal 508 may be raised or lowered to expose substrate 512 to microvolume 507 and/or to vary a volume of microvolume 507. For example, in a substrate transfer phase, pedestal 508 may be raised to position substrate 512 within microvolume 507. In some embodiments, microvolume 507 may completely enclose substrate 512 as well as a portion of pedestal 508 to create a region of high flow impedance.

Optionally, pedestal 508 may be lowered and/or raised during portions the process to modulate process pressure, reactant concentration, etc., within microvolume 507. In one scenario where process chamber body 502 remains at a base pressure during the process, lowering pedestal 508 may allow microvolume 507 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller 550.

In another scenario, adjusting a height of pedestal 508 may allow a plasma density to be varied during plasma activation processes. For example, the plasma may be activated when the inhibitor gas is introduced to the chamber body 502, or when the second reactant is flowed to the chamber body 502. In some embodiments, a plasma may not be activated during flow of the inhibitor gas or the flow of the second reactant. At the conclusion of the process phase, pedestal 508 may be lowered during another substrate transfer phase to allow removal of substrate 512 from pedestal 508.

While the example microvolume variations described herein refer to a height-adjustable pedestal 508, it will be appreciated that, in some embodiments, a position of showerhead 506 may be adjusted relative to pedestal 508 to vary a volume of microvolume 507. Further, it will be appreciated that a vertical position of pedestal 508 and/or showerhead 506 may be varied by any suitable mechanism within the scope of the present disclosure. In some embodiments, pedestal 708 may include a rotational axis for rotating an orientation of substrate 512. It will be appreciated that, in some embodiments, one or more of these example adjustments may be performed programmatically by one or more suitable controllers 550.

Plasmas for ALD processes may be generated by applying a radio frequency (RF) field to a gas using two capacitively coupled plates. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. Non-limiting examples of electrodes include process gas distribution showerheads and substrate support pedestals. It will be appreciated that plasmas for ALD processes may be formed by one or more suitable methods other than capacitive coupling of an RF field to a gas. In some embodiments, the plasma is a remote plasma, such that second reactant is ignited in a remote plasma generator upstream of the station, then delivered to the station where the substrate is housed.

Showerhead 506 and pedestal 508 electrically communicate with a radio frequency (RF) power supply 514 and matching network 516 for powering a plasma. In some embodiments, the plasma energy may be controlled by controlling one or more of a process station pressure, gas concentrations and partial pressures of gases or gas flow rates, an RF source power, an RF source frequency, and a plasma power pulse timing. For example, RF power supply 714 and matching network 516 may be operated at any suitable power to form a plasma having a desired ion energy. Examples of suitable powers are included above. Likewise, RF power supply 514 may provide RF power of any suitable frequency. In some embodiments, RF power supply 514 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

The ALD process station 500 may also be used for CVD processes.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 550 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as disilane), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for setting a flow rate of an inert, inhibitor and/or reactant gas which may be the same as or different from the gas used in the first recipe phase, instructions for modulating a flow rate of a carrier gas, and time delay instructions for the third recipe phase. A fourth recipe phase may include instructions for modulating or stopping a flow rate of an inert and/or a reactant gas (e.g., a second reactant such as nitrogen or a nitrogen-containing or oxygen-containing gas), instructions for modulating the flow rate of a carrier or purge gas, and time delay instructions for the fourth recipe phase. It will be appreciated that these recipe phases may be further subdivided and/or iterated in any suitable way within the scope of the present disclosure.

In some embodiments, pedestal 508 may be temperature controlled via heater 510. Further, in some embodiments, pressure control for process station 500 may be provided by butterfly valve 518. As shown in the embodiment of FIG. 5, butterfly valve 518 throttles a vacuum provided by a downstream vacuum pump (not shown). However, in some embodiments, pressure control of process station 500 may also be adjusted by varying a flow rate of one or more gases introduced to the process station 500.

Figure 6:
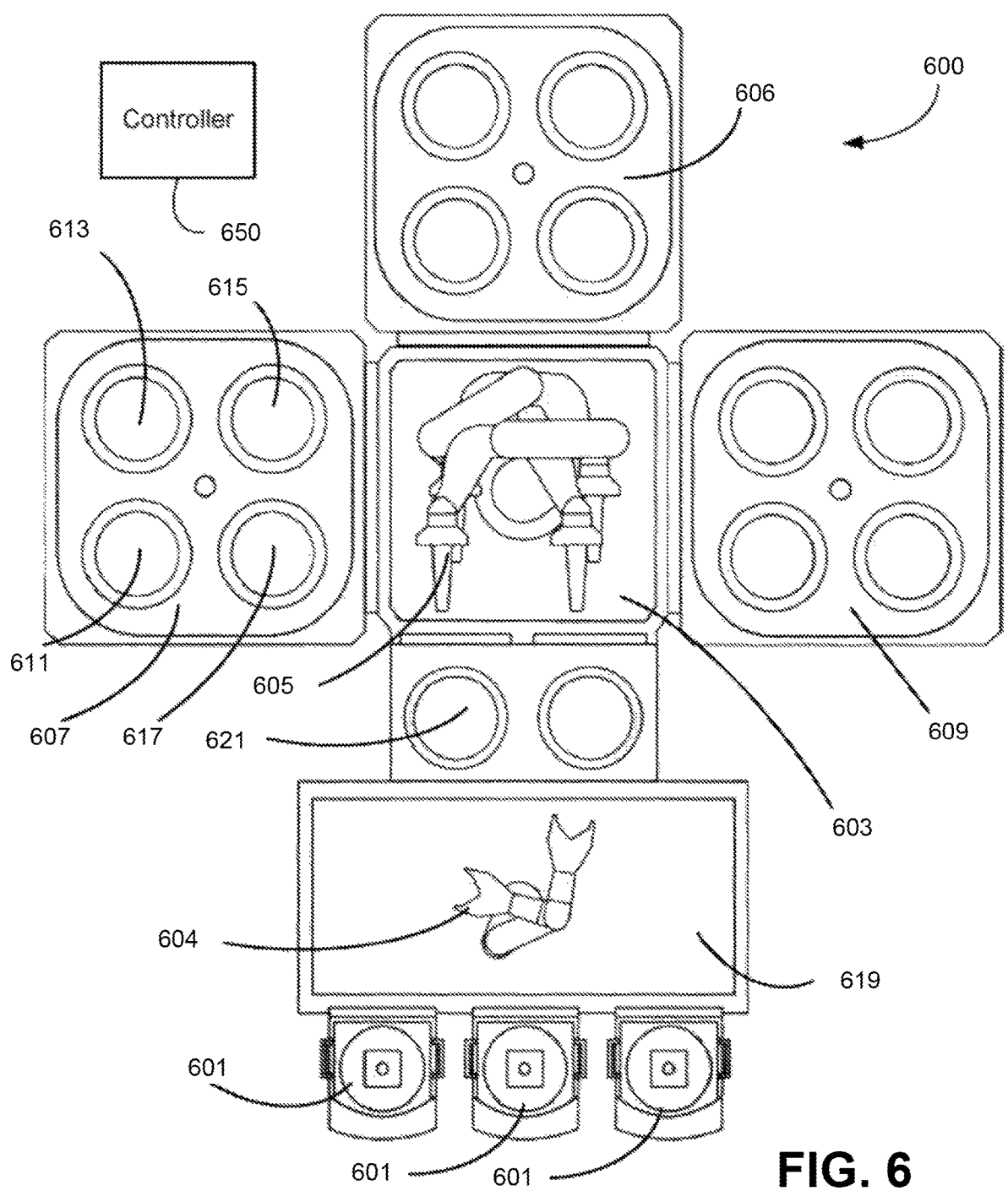
FIG. 6 is a schematic illustration of an embodiment of a multi-station processing tool that may be used to perform methods described herein.

As described above, one or more process stations may be included in a multi-station processing tool. FIG. 6 shows a schematic view of an embodiment of a multi-station processing tool 600 with an inbound load lock 602 and an outbound load lock 604, either or both of which may include a remote plasma source. A robot 606, at atmospheric pressure, is configured to move wafers from a cassette loaded through a pod 608 into inbound load lock 602 via an atmospheric port 610. A wafer is placed by the robot 606 on a pedestal 612 in the inbound load lock 602, the atmospheric port 610 is closed, and the load lock is pumped down. Where the inbound load lock 602 includes a remote plasma source, the wafer may be exposed to a remote plasma treatment in the load lock prior to being introduced into a processing chamber 614. Further, the wafer also may be heated in the inbound load lock 602 as well, for example, to remove moisture and adsorbed gases. Next, a chamber transport port 616 to processing chamber 614 is opened, and another robot (not shown) places the wafer into the reactor on a pedestal of a first station shown in the reactor for processing. While the embodiment depicted in FIG. 6 includes load locks, it will be appreciated that, in some embodiments, direct entry of a wafer into a process station may be provided.

The depicted processing chamber 614 includes four process stations, numbered from 1 to 4 in the embodiment shown in FIG. 6. Each station has a heated pedestal (shown at 618 for station 1), and gas line inlets. It will be appreciated that in some embodiments, each process station may have different or multiple purposes. While the depicted processing chamber 614 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 6 depicts an embodiment of a wafer handling system 690 for transferring wafers within processing chamber 614. In some embodiments, wafer handling system 690 may transfer wafers between various process stations and/or between a process station and a load lock. It will be appreciated that any suitable wafer handling system may be employed. Non-limiting examples include wafer carousels and wafer handling robots. FIG. 6 also depicts an embodiment of a system controller 650 employed to control process conditions and hardware states of process tool 600. System controller 650 may include one or more memory devices 656, one or more mass storage devices 654, and one or more processors 652. Processor 652 may include a CPU or computer, analog and/or digital input/output connections, stepper motor controller boards, etc.

In some embodiments, system controller 650 controls all the activities of process tool 600. System controller 650 executes system control software 658 stored in mass storage device 654, loaded into memory device 656, and executed on processor 652. Alternatively, the control logic may be hard coded in the controller 650. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 858 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 600. System control software 658 may be configured in any suitable way. For example, various process tool component subroutines or control objects may be written to control operation of the process tool components used to carry out various process tool processes. System control software 858 may be coded in any suitable computer readable programming language.

In some embodiments, system control software 658 may include input/output control (IOC) sequencing instructions for controlling the various parameters described above. Other computer software and/or programs stored on mass storage device 654 and/or memory device 656 associated with system controller 650 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 618 and to control the spacing between the substrate and other parts of process tool 600.

A process gas control program may include code for controlling gas composition (e.g., silicon-containing precursor, co-reactant, inhibition, passivation, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 650. The user interface may include a display screen, graphical software displays of the apparatus and/or process conditions, and user input devices such as pointing devices, keyboards, touch screens, microphones, etc.

In some embodiments, parameters adjusted by system controller 850 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 650 from various process tool sensors. The signals for controlling the process may be output on the analog and digital output connections of process tool 600. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 650 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 650 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 650.

In some implementations, the system controller 650 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 850, depending on the processing conditions and/or the type of system, may be programmed to control any of the processes disclosed herein, including the delivery of processing gases and/or inhibitor gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 650 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 650 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 650, in some implementations, may be a part of or coupled to a computer that is integrated with, coupled to the system, otherwise networked to the system, or a combination thereof. For example, the system controller 650 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 650 receives instructions in the form of data, which specify parameters for each of the processing steps to be performed during one or more operations. The parameters may be specific to the type of process to be performed and the type of tool that the system controller 650 is configured to interface with or control. Thus, as described above, the system controller 650 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 850 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
   providing a structure comprising features and an open gap between the features, the open gap including sidewall and bottom surfaces and having a depth; and
   performing one or more inhibition blocks, each inhibition block comprising:
   a) exposing the structure to an inhibition treatment to inhibit dielectric deposition on the sidewall and bottom surfaces of the gap, and
   b) selectively depositing dielectric film near the top of the gap without significant deposition near the bottom surface of the gap.

2. The method of claim 1, further comprising closing the gap with deposited dielectric material, thereby forming a closed air gap between the features.

3. The method of claim 2, wherein the gap is closed during an inhibition block.

4. The method of claim 2, further comprising, after the performing the one or more inhibition blocks, performing a deposition to close the gap.

5. The method of claim 2, wherein the gap is closed with surface inhibition species remaining in the closed air gap.

6. The method of claim 2, wherein the top of the closed gap is below the top of the features.

7. The method of claim 1, further comprising performing a passivation operation to remove surface inhibition species from the sidewall and/or bottom surfaces prior to closing the gap.

8. The method of claim 7, wherein at least one inhibition block comprises a passivation operation.

9. The method of claim 7, wherein the passivation operation is performed after performing one or more inhibition blocks.

10. The method of claim 7, wherein the passivation operation comprises exposing the structure to an oxygen plasma.

11. The method claim 1, wherein (b) is performed without significant deposition within most of the gap.

12. The method of claim 1, wherein the inhibition treatment includes halogen species.

13. The method of claim 1, further comprising depositing a conformal dielectric layer on the sidewall and bottom surfaces prior to performing the one or more inhibition blocks.

14. The method of claim 13, wherein exposure to the inhibition treatment results in treating the conformal dielectric layer such that inhibition species are adsorbed onto or react with the conformal dielectric layer.

15. The method of claim 13, further comprising, after closing the gap, depositing a dielectric cap layer over the features and gap by chemical vapor deposition.

16. The method of claim 15, wherein the dielectric cap layer is deposited in the same chamber as the inhibition blocks are performed.

17. The method of claim 1, wherein the features are metal lines.

18. The method of claim 1, wherein the inhibition block further comprises selectively removing inhibition from the top of the gap between (a) and (b).

19. A method comprising:
providing a structure comprising features and an open gap between the features, the open gap including sidewall and bottom surfaces and having a depth; and
and performing one or more inhibition blocks, each inhibition block comprising:
(a) exposing the structure to an inhibition treatment to inhibit dielectric deposition on the sidewall and bottom surfaces of the gap, and
(b) performing one or more atomic layer deposition (ALD) cycles to selectively deposit dielectric film near the top of the gap without significant deposition near the bottom surface of the gap.

20. A method comprising:
providing a structure comprising features and an open gap between the features, the open gap including sidewall and bottom surfaces and having a depth; and
performing one or more inhibition blocks, each inhibition block comprising:
(a) exposing the structure to an inhibition treatment to inhibit dielectric deposition on the sidewall and bottom surfaces of the gap, and
(b) performing a chemical vapor deposition (CVD) operation to selectively deposit dielectric film near the top of the gap without significant deposition near the bottom surface of the gap.

* * * * *